United States Patent [19]
Burbano et al.

[11] Patent Number: 6,147,874
[45] Date of Patent: Nov. 14, 2000

[54] BACKPLATE FOR SECURING PRINTED CIRCUIT CARD TO A COMPUTER CHASSIS

[75] Inventors: Carlos Burbano, Milpitas; Brian Geroge Reeve, San Jose, both of Calif.

[73] Assignee: 3Com Corporation, Santa Clara, Calif.

[21] Appl. No.: 09/215,102

[22] Filed: Dec. 18, 1998

[51] Int. Cl.⁷ ..................................................... H05K 5/00
[52] U.S. Cl. .......................... 361/759; 361/759; 361/801; 361/802; 248/222.11; 248/225.11
[58] Field of Search ..................................... 361/754, 789, 361/801, 802, 825; 74/72 A; 248/200, 222.11, 223.41, 225.11, 225.21

[56] References Cited

U.S. PATENT DOCUMENTS

| | | | |
|---|---|---|---|
| 4,791,524 | 12/1988 | Teigen et al. | 361/752 |
| 4,873,395 | 10/1989 | Mast | 174/35 |
| 4,971,563 | 11/1990 | Wells | 439/61 |
| 4,987,517 | 1/1991 | Kurz | 361/683 |
| 5,004,867 | 4/1991 | Mast | 174/35 |
| 5,317,483 | 5/1994 | Swindler | 361/801 |
| 5,398,156 | 3/1995 | Steffes et al. | 361/683 |
| 5,575,546 | 11/1996 | Radloff et al. | 312/183 |
| 5,650,922 | 7/1997 | Ho | 361/799 |
| 5,986,892 | 11/1999 | Hargy, III | 361/759 |
| 6,069,796 | 5/2000 | Hastings et al. | 361/754 |

*Primary Examiner*—Jeffrey Gaffin
*Assistant Examiner*—Tuan Dinh
*Attorney, Agent, or Firm*—Van Mahamedi; Wilson Sonsini Goodrich & Rosati

[57] ABSTRACT

A backplate, or network circuit card assembly having a backplate is provided having an elongated section with one or more stem sections extending therefrom in a first direction. Each stem section includes heads that extend in a second direction. The heads may be positioned from an unbiased position to a biased position, where the biased position brings the heads into sufficient proximity with one another to allow the combined heads to pass through a hole of the printed circuit card. Once through, the heads are released to secure the printed circuit card with the stem section. The heads may also provide a surface that contacts a grounding plane of the printed circuit card.

34 Claims, 6 Drawing Sheets

BACKPLATE FOR SECURING PRINTED CIRCUIT CARD TO A COMPUTER CHASSIS

BACKGROUND OF THE INVENTION

The present invention pertains to backplates that secures a substrate to a computer chassis. More specifically, the present invention pertains to a backplate that secures to a substrate of a circuit card or printed circuit board without the use of mechanical fasteners.

Personal computers utilize substrates such as circuit cards and printed circuit boards within the computer chassis to interconnect with other electrical components and peripherals, such as modems. The substrates may be used by consumers or manufacturers to provide additional functional capabilities to an existing personal computer or computer system. As an example, substrates such as circuit cards may be used to provide standard bus interfaces for peripheral devices, such as audio and video devices, tape controllers, modems and other peripherals. Still further, substrates such as network circuit cards may be secured to the computer chassis by the backplate, for the purpose of providing modem and/or communication capabilities to the computer.

Typically, circuit cards and other circuit carrying substrates are made available to the manufacturer or consumer as assemblies with the backplate attached to the substrate, so that the consumer and/or manufacturer need only attach the backplate to the computer chassis to secure the substrate in the computer. The backplate and substrate are usually assembled using manual assembly lines. As known in the art, at least two sets of mechanical fasteners are needed to secure the backplate to the substrate. In light of the large number of substrate assemblies that are manufactured, use of mechanical fasteners to secure substrates with backplate adds substantial labor and material expenses to the production cost.

In addition, the circuitry on the substrate often require a chassis ground which may be provided by the backplate. However, the known art lacks an efficient and secure method of employing the backplate as the chassis ground to the substrate. Mechanical fasteners are not always retained or precisely fitted into the substrate to interconnect the ground of the substrate with the backplate. Moreover, manually aligning the fasteners to ground the substrate requires additional labor and/or equipment costs.

These and other shortcomings of the known art are addressed with this invention.

SUMMARY OF THE INVENTION

In one preferred embodiment of the present invention, a backplate is provided having an elongated section orthogonally joined to a top section. A first stem section extends from the elongated section in a first direction. A first and second head extend from the first and second stem section in a second direction. Each head has a distal tip section that deflects from an unbiased position to a biased position which is proximate to the other head. The first and second head are each dimensioned to fit within a hole on a substrate when biased towards one another. The backplate of this embodiment may also be provided a second stem section that extends from the elongated section in the first direction. The second stem section includes a first and second head extending from the second stem section in the second direction. Each head of the second stem section includes a distal tip section that deflects from an unbiased position to a biased position that is proximate the other head. The first and second head are each dimensioned to fit within a hole on the substrate when biased towards one another to secure the substrate with the respective stem section.

In addition, the first embodiment may also provide the head of each stem section with a base adjacent to the corresponding stem section. Each base has a recessed surface on the head that is dimensioned to frictionally engage the substrate inserted thereon. The backplate of this embodiment may also include a catch member that extends from the elongated section and is sufficiently spaced from the stem section to frictionally engage the substrate.

In another embodiment of the present invention, a backplate is provided a top stems section extending from the elongated section in a first direction and including a first and second stem. Each stem includes a head that extends in a second direction. A bottom stem section also extends from the elongated section in the first direction and includes a first and second stem. Each stem of the bottom stem section also includes a head that extends in the second direction. The heads of the first and second stem in each stem section are spaced apart, with each head able to deflect from an unbiased position distal to the other head to a biased position proximate to the other head, the heads of each stem section combining to insert into a hole of the substrate when they are in the biased position.

In still another embodiment of the present invention, a network interface card assembly is provided with the backplate of the present invention. Moreover, the features described with the variations of this invention are interchangeable between the various embodiments.

DESCRIPTION OF THE PRESENTLY PREFERRED EMBODIMENTS

This invention provides a backplate for retaining substrates such as circuit cards in a computer chassis. The backplate improves over the prior art by providing unitary structural features for retaining the substrate without mechanical fasteners. As such, the backplate of this invention may be secured to the substrate more readily than other backplates known in the art. In addition, the backplate of this invention avoids labor costs and material expenses associated with employing mechanical fasteners to secure the substrate to the backplate. Another advantage of the present invention is that the substrate and backplate may be engaged tactilely such that the substrate "snaps" into a secure position. The tactile engagement readily verifies securement of the substrate with the backplate during manual assembly. These and other advantages of this invention will be made clear below.

Figure 1:
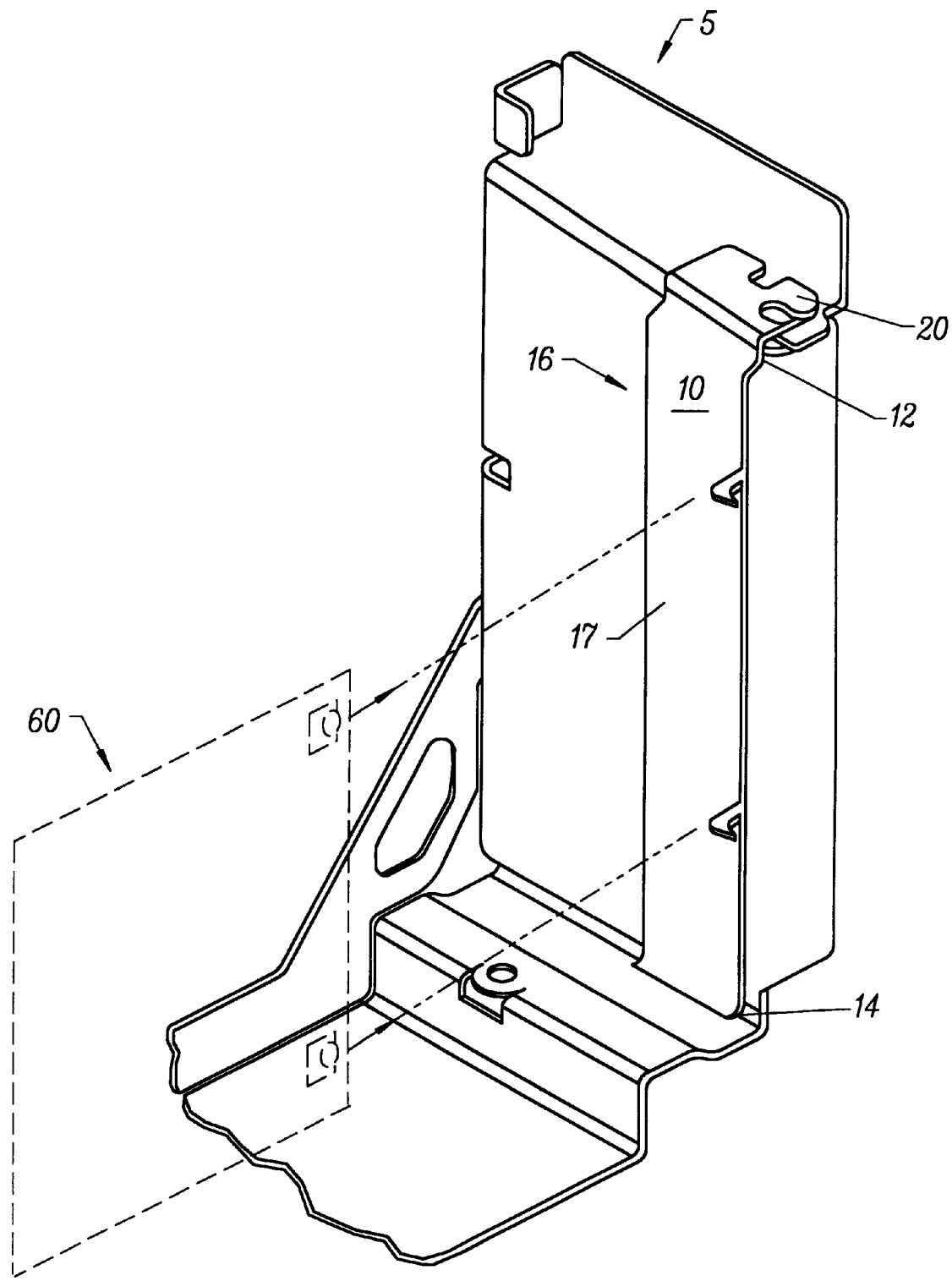
FIG. 1 is an isometric perspective of a backplate of the first preferred embodiment secured to a computer chassis, with a substrate for use in the preferred embodiment shown in phantom.

FIG. 1 shows a first preferred embodiment of the present invention comprising one piece backplate 10 for receiving a substrate 60 (shown in phantom). The backplate is referenced with respect to a longitudinal axis extending between a top edge 12 and a bottom edge 14. The top edge 12 orthogonally joins a top section 20 with an elongated section 16. The top section 20 receives one or more fasteners to mount the backplate to a computer chassis 5. The elongated section 16 includes a front face 17 for securing the substrate, and a back face 19 (shown in FIG. 1) that abuts the chassis 5 once the backplate is secured. The backplate retains the substrate to the front face 17 in a fixed position for electrical communication with the motherboard and other computer circuitry.

Figure 2:
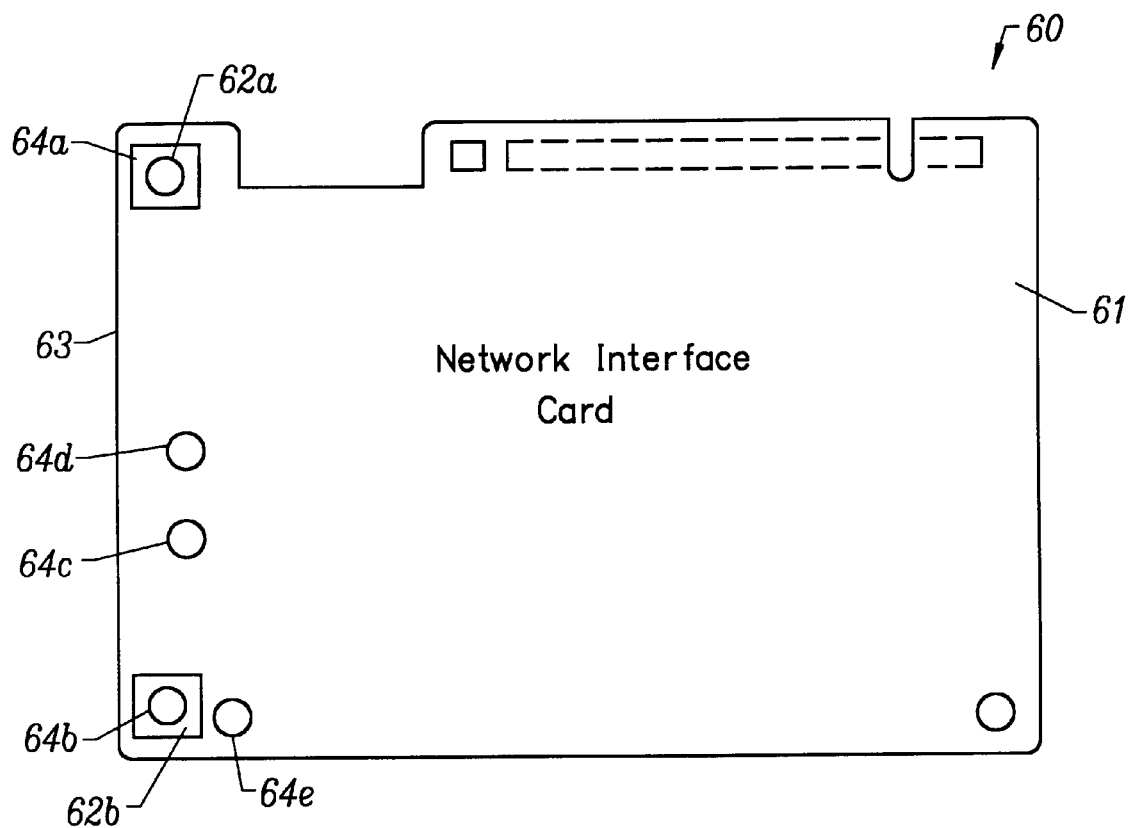
FIG. 2 is a front view of the substrate preferred with this invention.

FIG. 2 shows the substrate for use with the preferred embodiment being a circuit card 60. The network circuit card includes a rectangular substrate 61 that secures edgewise to the backplate 10 (FIG. 1), so that both planar sides of the substrate may be fully accessible for electrical communication. The network circuit card may be manufactured for a variety of uses and may differ in mechanical and electrical design, including providing circuitry on one or both sides of the substrate. In the preferred embodiment, the circuit card is a network interface circuit card for interfacing or communicating with a network such as the Internet. The substrate also include grounding planes 62a, 62b for grounding the circuit card with the computer chassis. The grounding planes 62 are generally positioned at the top and bottom corners of the corners near an edge 63 secured to the backplate. The substrate 61 may also include two or more fastener holes 64a and 64b for receiving fasteners that secure the circuit card with the backplate. Other fastener holes 64c–e may also be used with this invention. At least two of the fastener holes 64 are typically located immediately adjacent to the grounding planes 62 and in proximity to the edge 63. White the preferred embodiment is described with respect to circuit cards, and more particularly network circuit cards, this invention may be used with any substrate having circuitry or electrical components mounted to a substrate, including printed wiring boards and printed circuit boards.

Figure 3:
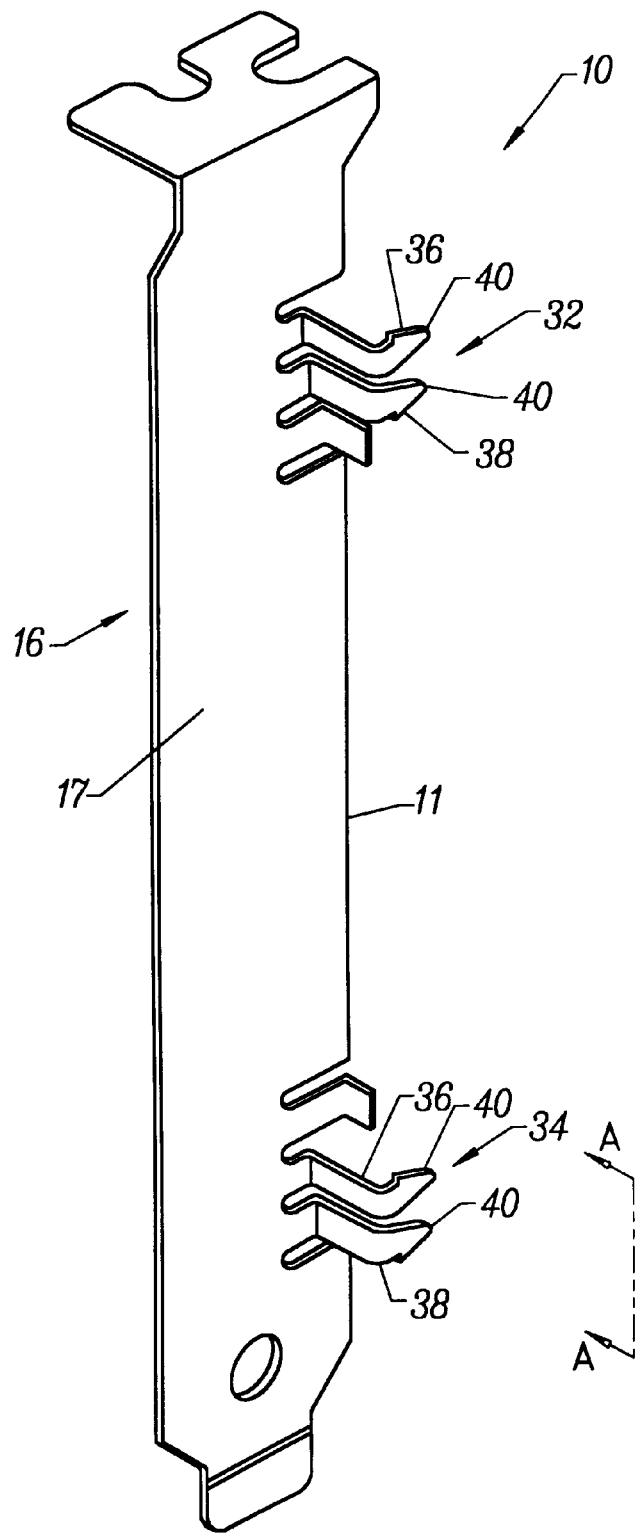
FIG. 3 is an isometric perspective of the backplate of this invention.

With respect to FIG. 3, the first preferred embodiment is shown with the backplate 10 including a top and bottom stem section 32 and 34 extending from an edge 11. Each stem section preferably includes two stems. As shown by FIG. 3, the preferred embodiment provides each stem section with a top and bottom stem 36, 38 that combine to secure the substrate in a fixed position. Each stem includes a head 40 that preferably extends in a lateral direction perpendicular to the stem. The present invention may also provide additional stems that extend from the edge 11, either with the stem section or as separate stem sections.

Figure 4:
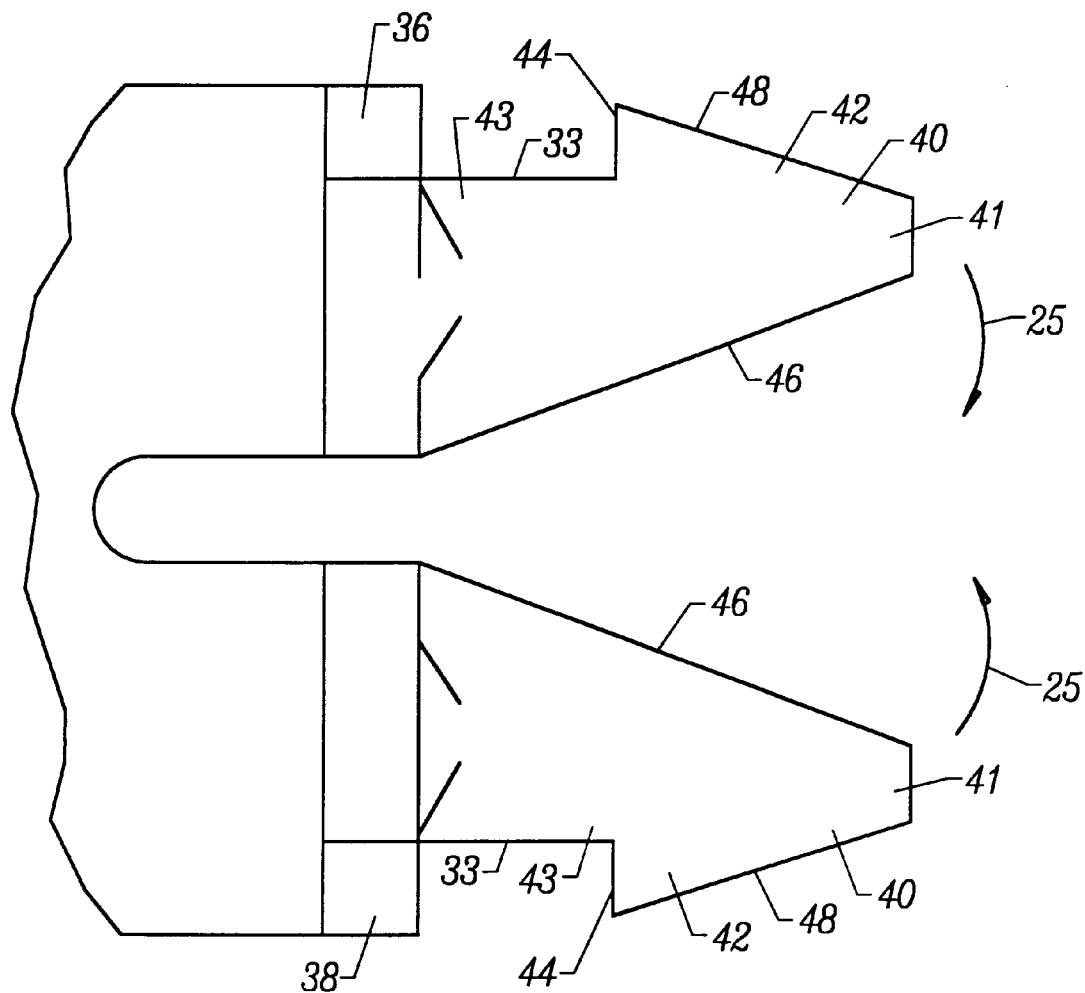
FIG. 4 is a close-up front view of the backplate from lines A—A in FIG. 3.

FIG. 4 is a partial front view of a stem section of the preferred embodiment. The top and bottom stems 36, 38 of the respective stem section 32, 34 each are provided a head 40 that extends perpendicularly from the respective stem. Each head 40 includes a distal tip section 41, an enlarged midsection 42, and a base neck 43. The base neck 43 includes a surface 33 recessed relative to the enlarged section 42, and is preferably dimensioned to frictionally retain the substrate of the printed circuit card 60 (FIG. 2) through the corresponding hole 62. The enlarged midsection 42 forms a wall 44 where it juxtaposes with the base neck 43. The head 40 and/or distal tip section 41 is positionable between an unbiased position shown in FIG. 2 having the distal tip sections 41 of each head 40 are furthest apart, and a biased position having the distal tip sections in close proximity or in contact with one another. The directional arrows 25 illustrate the range of motion of the heads 40 and/or distal tip section 41. Preferably, the heads 40 of each stem section are dimensioned so that when they are biased, they combine to be inserted into matching holes 62a, 62b of the printed circuit card 60 (FIG. 2). When unbiased, the distal tip sections 41 are sufficiently spaced to obstruct removal of the printed circuit card 60 from the corresponding stem section. The enlarged midsection 42 of one or both of the heads in either or both of the stems sections may be further dimensioned so that the respective walls 44 contact the grounding planes 62a, 62b on the printed circuit card 60 (FIG. 2) to provide a chassis ground. In this manner, the backplate 10 may provide a reliable chassis ground to the printed circuit card. The exact dimensions of each head 40 may further depend on the holes 62a, 62b of the selected printed circuit card.

As previously mentioned and shown by FIG. 4, the preferred embodiment incorporates two stems in each stem section 32, 34 having heads 40 spaced apart and biased when moved towards one another. Preferably, each head 40 is farther defined by an inner side 46 facing the other head, and an outer side 48. The inner and outer side 46 and 48 are angled with respect to each other to define in part the distal tip section 41. One portion of the outer side of each head may be straight to provide the recessed surface 33 of the base neck 43. In the preferred embodiment of FIG. 4, the maximum girth of the head 40 is shown to be at the enlarged section 42 where the wall 44 meets the recessed surface 33, and the minimum girth is at the distal tip section 41. The inner and outer surface 46 and 48 of each head is slanted to extend from the maximum girth section of the enlarged section 42 to the minimum girth section of the distal tip section 41. In the preferred embodiment shown by FIG. 4, the angle between the respective inner and outer surfaces 46 and 48 of each head 40 is approximately 20 degrees. The slanted configuration between the enlarged section 42 and the distal tip section 41 of each head 40 allows for easier manual assembly of the invention with the printed circuit card 60.

Figure 5:
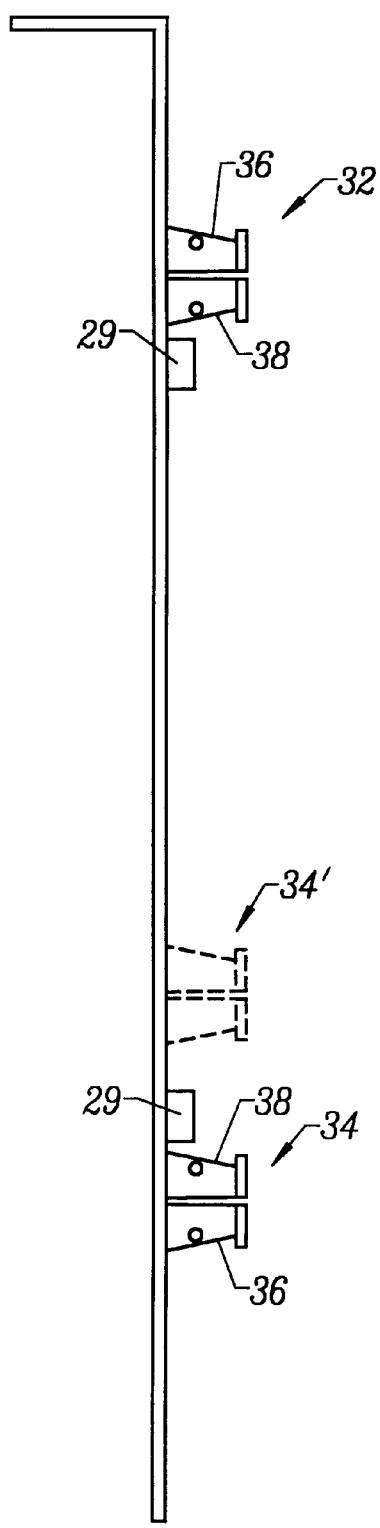
FIG. 5 is a side view of the backplate of this invention.

FIG. 5 shows the longitudinal position of the top stem section 32 and bottom stem section 34 may be determined by the position of the grounding planes 62 and/or fastener holes 64 of the particular printed circuit card being employed with the backplate. The preferred arrangement of FIG. 5 is aligned to receive the printed circuit card having grounding planes and holes at a top and bottom edge. However, the top stem section 32 and bottom stem section 34 may each be moved closer to the center line of the elongated section 16 if necessitated by the design of the printed circuit card. Additional and/or substitute stem sections such as bottom stem section 34' are shown in phantom. The backplate 10 may also include protrusions 29 that space and/or support the secured printed circuit card.

Figure 6:
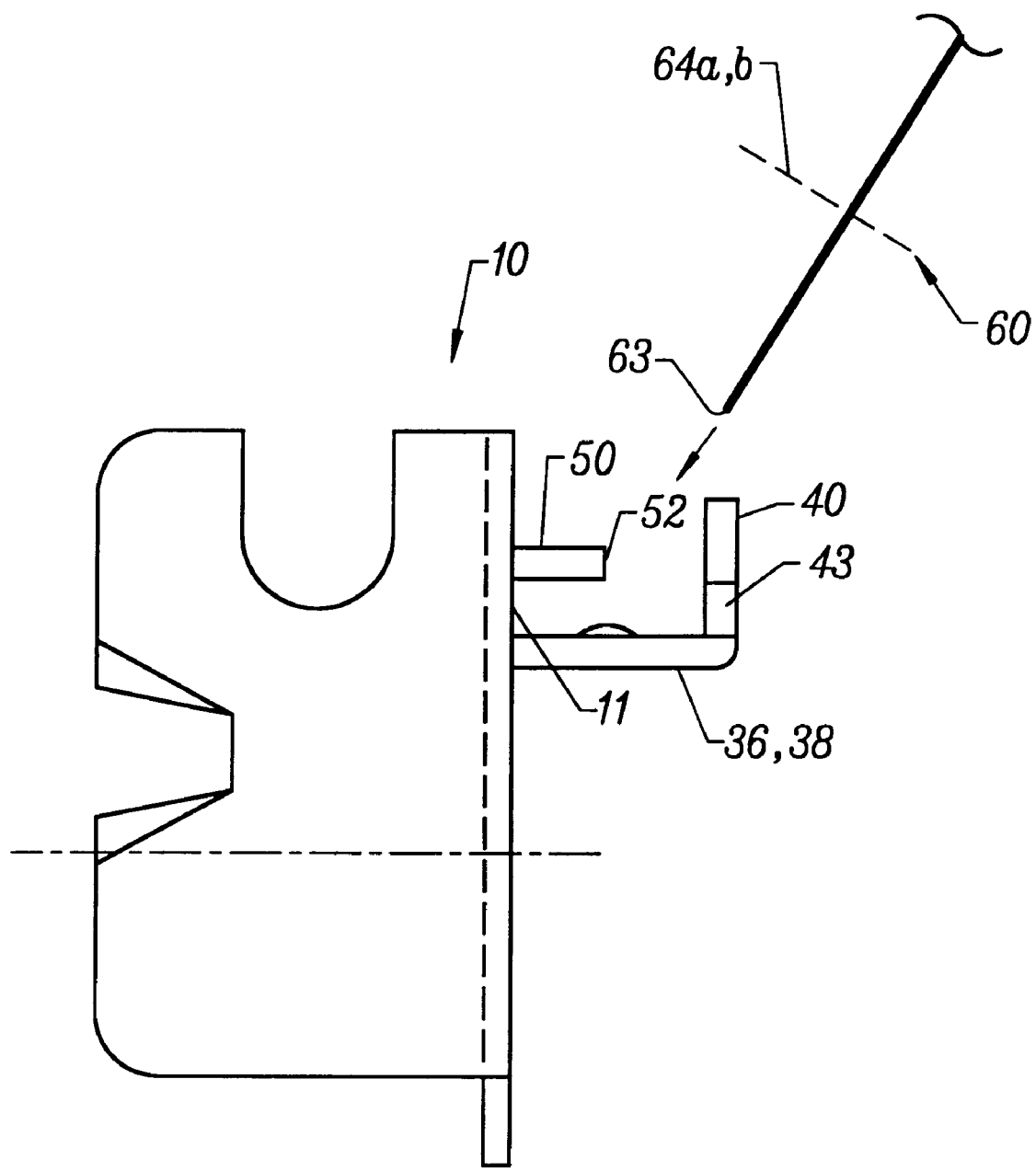
FIG. 6 is a top view of the backplate of this invention receiving the substrate.

With reference to FIG. 6, the structure of the preferred embodiment may be practiced in the following manner. FIG. 6 shows is a top end view of the preferred backplate 10 receiving the printed circuit card 60. The backplate 10 of the printed circuit card is angularity inserted into the an opening 52 defined by a catch member 50 and the stems 36, 38. The edge 63 of the printed circuit card is slid along the catch member to contact the edge 11. The stems 36, 38 are dimensioned such that the corresponding heads 40 align with holes 64a, 64b, or other holes as may be required from the printed circuit card, when the edge 63 of the printed circuit card 60 contacts the edge 11. Once the respective stems 36, 38 and hole are aligned in the manner, the heads 40 of each stem may be biased towards one another and inserted through the corresponding hole of the printed circuit card. The heads 40 are then released from the biased position and secure the printed circuit card to the recessed surface 33 of the base neck 43. The distance between the stems 36, 38 and the catch member 50 is also preferably dimensioned to secure the printed circuit card.

Preferably, the embodiments of this invention are formed from metals, including "301 stainless steel ½ hard", or "cold roll steel" manufactured by Thomas Steel Strip. The backplates may be manufactured by methods known in the art, including hard and soft tooling.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical applications, thereby enabling others skilled in the art to understand the invention for various embodiments and with various modifications as are suited to the particular use contemplated. It is intended that the scope of the invention be defined by the following claims and their equivalents.

What is claimed is:

1. A backplate for retaining a substrate to a computer chassis, comprising:
    a body having an elongated section, and a top section substantially perpendicular to the elongated section for attaching the backplate to the computer chassis;
    a first stem section extending from the elongated section in a first direction; and
    a first and second head extending from the first stem section in a second direction, each head having a distal tip section that deflects from an unbiased position to a biased position that is proximate the other head, the first and second head each being dimensioned to fit within a hole on the substrate when biased towards one another to secure the substrate to the first stem section.

2. The backplate of claim 1, wherein the first direction is substantially perpendicular to the elongated section, and the second direction is substantially perpendicular to the first direction.

3. The backplate of claim 2, wherein the first stem section is at a top portion of the elongated section, and the second stem section is at a bottom portion of the elongated section.

4. The backplate of claim 1, further comprising:
    a second stem section extending from the elongated section in the first direction; and
    a first and second head extending from the second stem section in the second direction, each head having a distal tip section that deflects from an unbiased position to a biased position that is proximate the other head, the first and second head each being dimensioned to fit within a hole on the substrate when biased towards one another to secure the substrate to the second stem section.

5. The backplate of claim 4, wherein the head of each stem section has a base adjacent to the corresponding stem section, each base having a recessed surface on the head that is dimensioned to frictionally engage the substrate.

6. The backplate of claim 5, further comprising a first and second catch member that extend from the elongated section, each catch member being sufficiently spaced from the corresponding stem section to frictionally engage the substrate inserted between the catch members and the respective stem sections.

7. The backplate of claim 6, wherein one of the heads includes an enlarged section that abuts the base and contacts a grounding plane on the substrate when the substrate is inserted thereon.

8. The backplate of claim 1, wherein each stem section has at least one stem.

9. The backplate of claim 1, wherein the first and second stem sections protrude from an edge of the backplate in longitudinal alignment.

10. The backplate of claim 7, wherein each head engages the substrate by deflecting from the unbiased position to the biased position so that the heads of each stem section combine to insert into the corresponding hole of the substrate.

11. The backplate of claim 10, wherein each head secures the substrate to the computer chassis by returning to the unbiased position from the biased position so that the base of each head and the corresponding catch member combine to secure the substrate against the corresponding stem section.

12. The backplate of claim 1, wherein the elongated section is planar.

13. The backplate of claim 1, wherein the substrate is a network interface card.

14. A backplate for retaining a substrate to a computer chassis, comprising:
    a body having an elongated section, and a top section substantially perpendicular to the elongated section for attaching the backplate to the computer chassis;
    a top stem section extending from the elongated section in a first direction and including a first and second stem, said first and second stem of the top stem section each having a head that extends in a second direction;
    a bottom stem section extending from the elongated section in the first direction and including a first and second stem, said first and second stem of the bottom stem section each having a head that extends in the second direction;
    the head of the first and second stems in each stem section being spaced apart, each head able to deflect from an unbiased position distal to the other head to a biased position proximate to the other head, the heads of each stem section combining to insert into a hole of a substrate when in the biased position.

15. The backplate of claim 14, further comprising a catch member that extends from the elongated section and is sufficiently spaced from either of the stem sections to frictionally engage the substrate inserted therein.

16. The backplate of claim 15, wherein the first direction is substantially perpendicular to the elongated section, and the second direction is substantially perpendicular to the first direction.

17. The backplate of claim 16, wherein the first stem section is at a top portion of the elongated section, and the second stem section is at a bottom portion of the elongated section.

18. The backplate of claim 17, wherein the head of each stem includes a base forming a recessed surface on the head that is dimensioned to frictionally engage the substrate inserted thereon.

19. The backplate of claim 18, wherein one of the heads includes an enlarged section that abuts the base and contacts a grounding plane on the substrate when the substrate is inserted thereon.

20. The backplate of claim 18, wherein one of the heads in each stem section includes an enlarged section that abuts the base and contacts a grounding plane on the substrate when the substrate is inserted thereon.

21. The backplate of claim 14, wherein the first and second stems of the respective stem sections protrude from an edge of the backplate in longitudinal alignment.

22. The backplate of claim 15, wherein the heads of the each stem section engage the substrate by deflecting from the unbiased position to the biased position so that the heads of each stem section combine to insert into the corresponding hole of the substrate.

23. The backplate of claim 19, wherein the heads of each stem section secure the substrate to the computer chassis by returning to the unbiased position from the biased position so that base and the catch member combine to secure the substrate against the corresponding stem section.

24. The backplate of claim 15, wherein the elongated section is planar.

25. The backplate of claim 15, wherein the substrate is a network interface card.

26. A network circuit card assembly, comprising:

a substrate having a plurality of holes;

a backplate having an elongated section, and a top section substantially perpendicular to the elongated section for attaching the backplate to the computer chassis;

a top stem section extending from the elongated section in a first direction and including a first and second stem, said first and second stem of the top stem section each having a head that extends in a second direction;

a bottom stem section extending from the elongated section in the first direction and including a first and second stem, said first and second stem of the bottom stem section each having a head that extends in the second direction;

the head of the first and second stems in each stem section being spaced apart, each head able to deflect from an unbiased position distal to the other head to a biased position proximate to the other head, the heads of each stem section combining to insert into the hole of the substrate when in the biased position.

27. The network circuit card of claim 26, further comprising a catch member that extends from the elongated section and is sufficiently spaced from the stem section to frictionally engage the substrate inserted thereon.

28. The network circuit card assembly of claim 27, wherein the first direction is substantially perpendicular to the elongated section, and the second direction is substantially perpendicular to the first direction.

29. The network circuit card assembly of claim 28, wherein the first stem section is at a top portion of the elongated section, and the second stem section is at a bottom portion of the elongated section, and each stem section is aligned so that the respective heads insert into some of the holes on the substrate.

30. The network circuit card assembly of claim 29, wherein the head of each stem includes a base forming a recessed surface on the head that is dimensioned to frictionally engage the substrate inserted thereon.

31. The network circuit card assembly of claim 30, wherein the substrate includes a grounding plane positioned immediately adjacent to one of the holes on the substrate.

32. The network circuit card assembly of claim 27, wherein one of the heads includes an enlarged section that abuts the base and contacts the grounding plane when the substrate is inserted thereon.

33. The network circuit card assembly of claim 28, wherein the first and second stems of the respective stem sections protrude from an edge of the backplate in longitudinal alignment.

34. The network circuit card assembly of claim 26, wherein the elongated section of the backplate is planar.

* * * * *

UNITED STATES PATENT AND TRADEMARK OFFICE
CERTIFICATE OF CORRECTION

PATENT NO.   : 6,147,874
DATED        : November 14, 2000
INVENTOR(S)  : Burbano, et al.

It is certified that error appears on the above-identified patent and that said Letters Patent are hereby corrected as shown below:

Column 1, line [75] Inventors:  Carlos Burbano, Milpitas;  Brian George Reeve, San Jose, both of Calif.

Signed and Sealed this

First Day of May, 2001

*Attest:*

NICHOLAS P. GODICI

*Attesting Officer*    *Acting Director of the United States Patent and Trademark Office*